United States Patent [19]
Hsu

[11] Patent Number: 5,425,652
[45] Date of Patent: Jun. 20, 1995

[54] FASTENING DEVICE IN AN IC SOCKET

[76] Inventor: Feng-Chien Hsu, 1st Fl., No. 121, Yun Ho St., Ta An Dist., Taipei, Taiwan, Prov. of China

[21] Appl. No.: 316,796

[22] Filed: Oct. 3, 1994

[51] Int. Cl.⁶ .............................................. H01R 4/50
[52] U.S. Cl. ..................................... 439/342; 439/266
[58] Field of Search ............... 439/159, 160, 259, 263, 439/264, 266, 270, 342

[56] References Cited

U.S. PATENT DOCUMENTS

| | | | |
|---|---|---|---|
| 4,648,669 | 3/1987 | Marks et al. | 439/342 X |
| 5,065,941 | 11/1991 | Suzuki et al. | 439/266 X |
| 5,167,515 | 12/1992 | Matsuoka et al. | 439/342 X |
| 5,170,117 | 12/1992 | Chio | 439/264 X |

Primary Examiner—Khiem Nguyen
Attorney, Agent, or Firm—Poms, Smith, Lande & Rose

[57] ABSTRACT

A fastening device is installed in an IC socket which includes a cover slidably engaged on a base. The fastening device includes a crank including a lateral rod and a longitudinal rod connected to the lateral rod, the lateral rod being received in between the cover and the base, the longitudinal rod being exposed out of the cover and the base, an upper ear and a lower ear being formed at one side of the cover and each receiving a periphery portion of the longitudinal rod. The lateral rod and the longitudinal rod of the crank have an angle relation less than ninety degrees thus when the longitudinal rod is retained in between the upper ear and the lower ear, a tension between the lateral rod and the longitudinal rod strengthens the retention.

7 Claims, 3 Drawing Sheets

FASTENING DEVICE IN AN IC SOCKET

BACKGROUND OF THE INVENTION

1. Field of the Invention

The present invention relates to a fastening device in an IC socket, especially and more particularly to an improved fastening device which retains the IC socket in a tight status thus securing an IC therein.

2. Description of the Prior Art

Some ICs such as central processing units (CPUs) are quite sensitive to temperature, thus they are apt to be damaged if exposed to high temperature for a period of time such as being directly soldered onto a printed circuit board. Therefore, it is common to provide an IC socket mating with the pins of the IC to replace the latter to be directly soldered on the printed circuit board, thus preventing the IC from being directly exposed to high temperature. For this purpose, a conventional IC socket is provided as shown in FIG. 6. The conventional IC socket shown separately comprises a base 90, a cover 80 slidably engaged on the base 90, and a crank 9 received in between the cover 80 and the base 90. The cover 80 defines a plurality of holes 81 in rows therein. Two ears 82 are formed on one side of the cover 80. The base 90 defines a plurality of slots 91 each of which corresponds to a hole 81 of the cover 80 and remains in communication with the hole 81 when the cover 80 slides on the base 90. The crank 9 comprises a lateral portion 94 and a longitudinal portion 95 perpendicular to the later portion 94. The lateral portion 94 of the crank 9 includes a substantially U-shaped portion 940 at a middle portion thereof and two straight portions 941 extend from the U-shaped portion 940. The U-shaped portion 940 has two pitches 942 at two sides thereof. The lateral portion 94 of the crank 9 is received in between the cover 80 and the base 90 while the longitudinal portion 95 thereof is exposed out of the cover 80 and the base 90. Normally the IC socket is defined as in a tight status where the longitudinal portion 95 is substantially adjacent to the side where the two ears 82 formed and a portion near one end of the longitudinal portion 95 is retained in between the two ears 82. In the tight status, each pair of the hole 81 and the slot 91 firmly receives an IC pin (not shown) of an IC (not shown), therefore the IC pin is not easily pulled out from the IC socket. When a user lifts the longitudinal portion 95 of the crank 9, the cover 80 is slid forward by the crank 9 for a distance less than a width of the slot 91, thus releasing retention on the IC pin and allowing the user to pull the IC from the IC socket easily. However, the conventional IC socket may be accidentally loosened from its tight status due to transportation shaking or accidental touch on the longitudinal portion 95 of the crank 9. FIG. 7 illustrates a portion of the longitudinal portion 95 of the crank 9 is retained in between the two ears 82. Since only one third of the periphery of the longitudinal portion 95 is in contact with the ears 82, the retention on the longitudinal portion 95 of the crank 9 is apt to be removed by accidental touching or vibration.

It is requisite to provide a new fastening device which retains the IC socket in tight status regardless accidental touch or shaking.

SUMMARY OF THE INVENTION

The primary objective of the present invention is to provide an improved fastening device in an IC socket for ensuring the IC socket is retained in a tight status.

In accordance with one aspect of the invention, there is provided a fastening device installed in an IC socket which includes a cover slidably engaged on a base. The fastening device includes a crank including a lateral rod and a longitudinal rod connected to the lateral rod, the lateral rod being received in between the cover and the base, the longitudinal rod being exposed out of the cover and the base, an upper ear and a lower ear being formed at one side of the cover and each receiving a periphery portion of the longitudinal rod. The lateral rod and the longitudinal rod of the crank have an angle relation less than ninety degrees thus when the longitudinal rod is retained in between the upper ear and the lower ear, a tension between the lateral rod and the longitudinal rod strengthens the retention.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
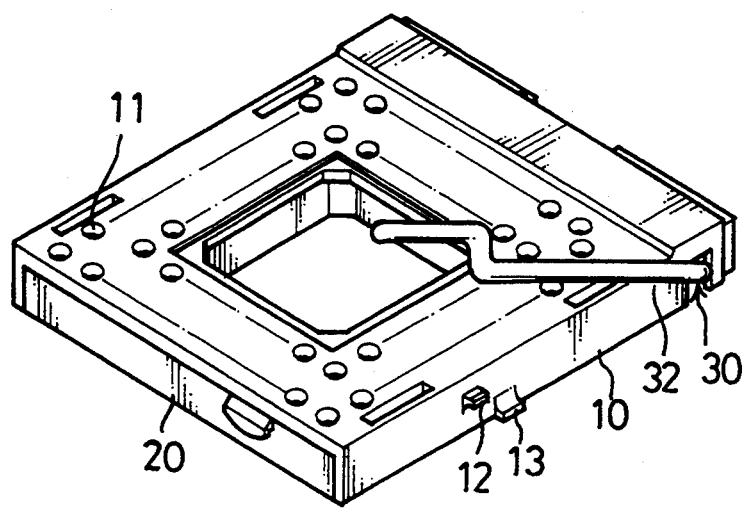
FIG. 1 is a perspective view of an IC socket, where a fastening device of the IC socket is not in a tight status for illustrative purpose.
Figure 2:
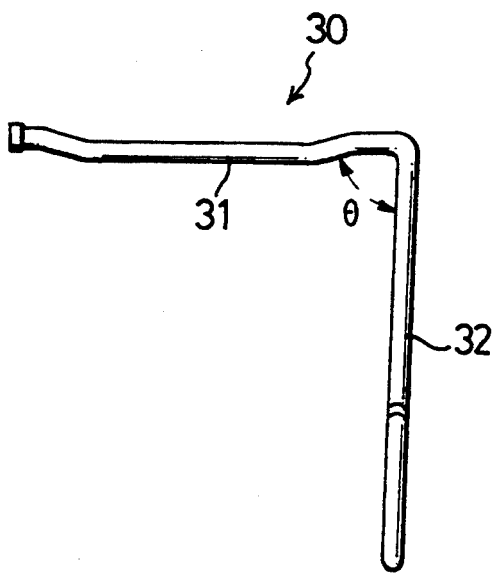
FIG. 2 is crank of the fastening device in accordance with the present invention.
Figure 3:
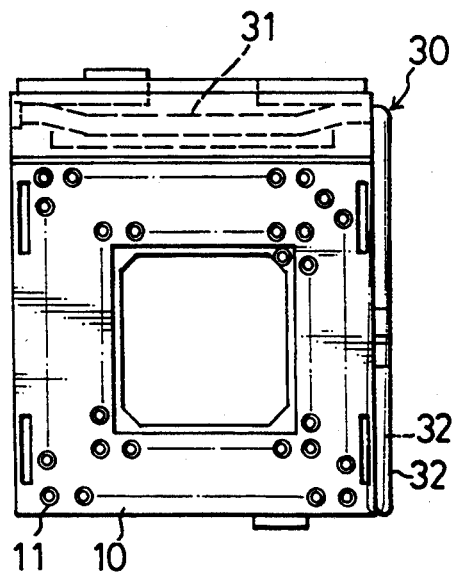
FIG. 3 is a top view of the IC socket, where a longitudinal portion of the crank is illustrated in phantom lines for illustrating that the longitudinal portion and the lateral portion of the crank have an angular relation less than 90 degrees.
Figure 5:
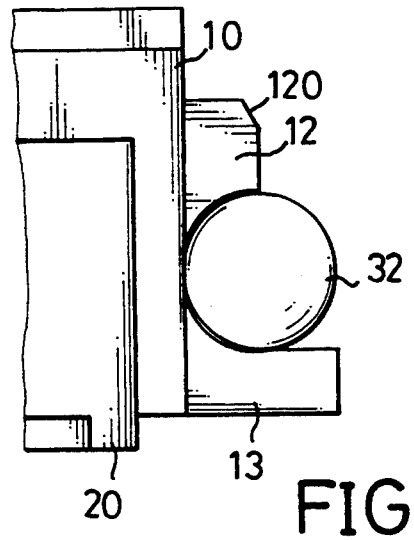
FIG. 5 is a partial rear view of the IC socket for showing the longitudinal portion of the crank is engaged in between the two ears of the IC socket.
Figure 4:
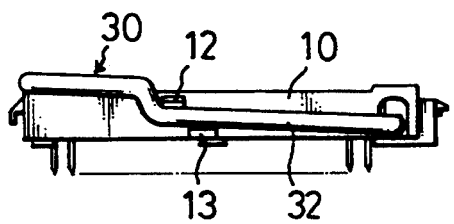
FIG. 4 is a side view of the IC socket for showing the longitudinal portion of the crank is retained in between two ears of the IC socket.
Figure 7:
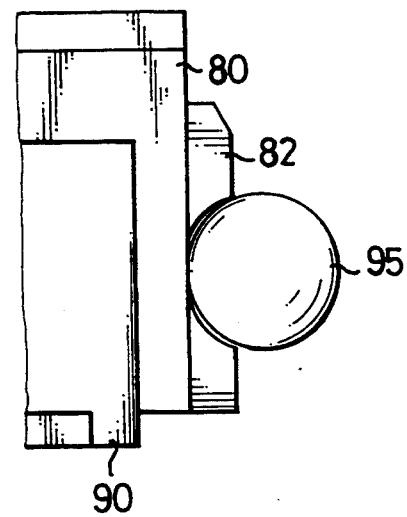
FIG. 7 is partial rear view of the conventional IC socket.
Figure 6:
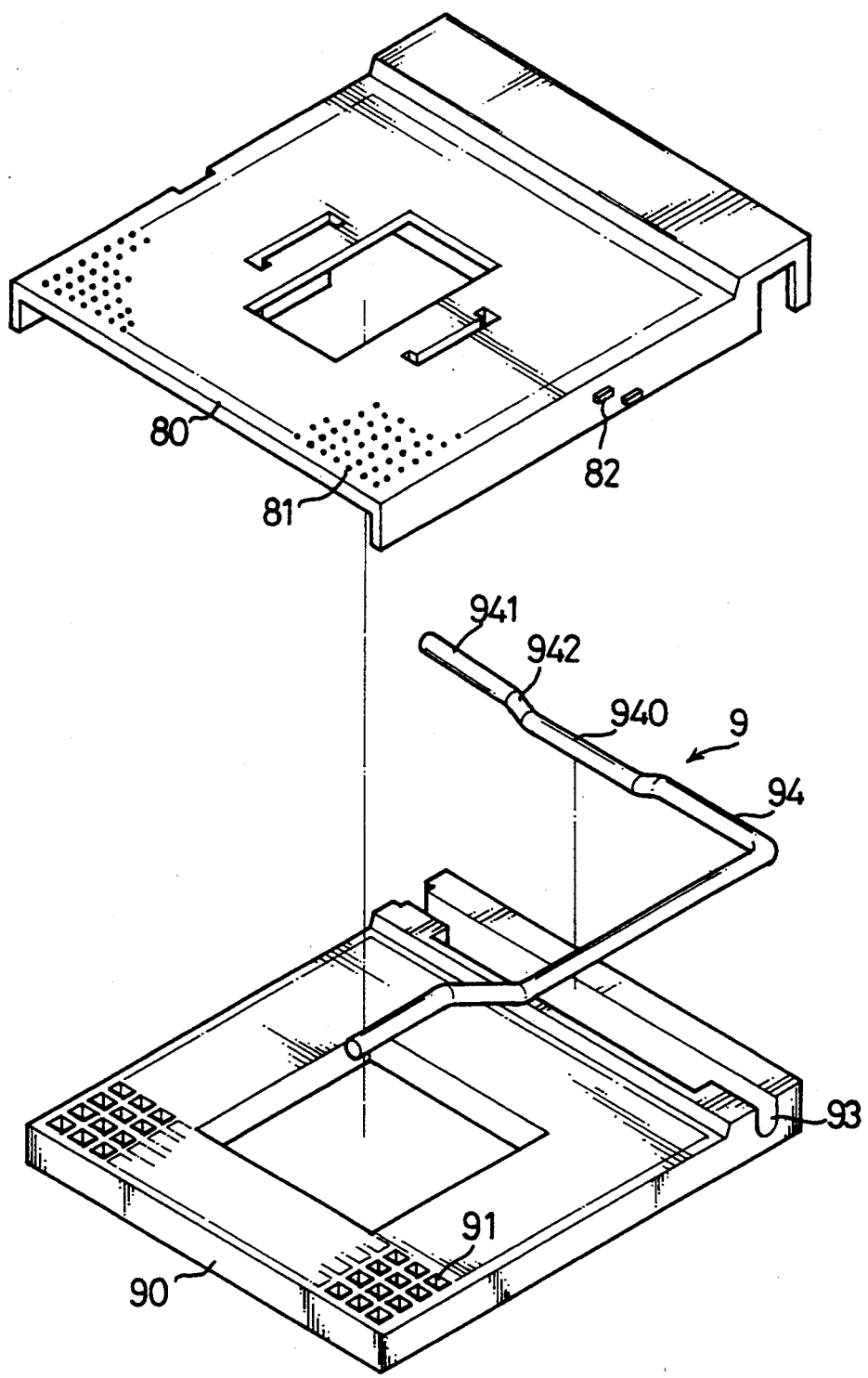
FIG. 6 is an exploded view of a conventional IC socket.

Referring to FIG. 1, an IC socket comprises a cover 10 slidably engaged on a base 20. The cover 10 defines a plurality of holes 11 therein for receiving IC pins (not shown) of an IC (not shown). A crank 30 is received in between the cover 10 and the base 20 and is operable to drive the cover 10 to slide on the base 20 thus changing the IC socket between a tight status and a released status. Also referring to FIG. 2, the crank 30 includes a lateral rod 31 and a longitudinal rod 32 connected to the lateral rod 31, and both rods 31 and 32 are angled less than 90 degrees. In this embodiment, an angle Θ between the lateral rod 31 and the longitudinal rod 32 is 88 degrees. The longitudinal rod 32 has one end thereof domed for safety when a user is operating the longitudinal rod 32. Actually, the lateral rod 31 is received in between the cover 10 and the base 20, while the longitudinal rod 32 is exposed out of the cover 10 and the base 20 allows a user to change the IC socket from a tight status to a released status. The cover 10 includes an upper ear 12 and a lower ear 13 at one side thereof. The longitudinal rod 32 of the crank 30 is operable to be positioned in between the upper ear 12 and the lower ear 13 and this is the tight status of the IC socket. Since the angle Θ between the lateral rod 31 and the longitudinal rod 32 is less than 90 degrees, the longitudinal rod 32 when lifted up as shown in the phantom lines 32 of FIG. 3 will be inclined into an extended surface from the side surface where the two ears 12 and 13 are formed. With this aspect, the longitudinal rod 32 of the crank 30 is firmly attached to the side surface of the cover 10 where the ears 12 and 13 are formed when the longitudinal rod 32 of the crank 30 is operated down to be partially received in between the two ears 12 and 13 as shown in FIG. 4. Referring to FIG. 5, the upper ear 12 has a lower surface formed arcuate for receiving a first portion of a periphery of the longitudinal rod 32 of the crank 30 and the lower ear 13 has an upper surface formed arcuate for receiving a second portion of the periphery of the longitudinal rod 32 of the crank 30. An upper corner of the upper ear 12 is formed with a slant surface 120 for guiding the longitudinal rod 32 to slide thereover and be positioned between the upper ear 12 and the lower ear 13. When the longitudinal rod 32 is operated down to drive the IC socket in the tight status. The upper ear 12 has a width slightly greater than a radius of the longitudinal rod 32 and the lower ear 13 has a width substantially equaling a diameter of the longitudinal rod 32, thus when the longitudinal rod 32 is retained in between the two ears 12 and 13, accidental touching or vibration can not remove the longitudinal rod 32 from the retention of the two ears 12 and 13.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A fastening device in an IC socket which includes a cover slidably engaged on a base, said fastening device comprising a crank including a lateral rod and a longitudinal rod connected to the lateral rod, said lateral rod being received in between the cover and the base, said longitudinal rod exposed out of the cover and the base, an upper ear being formed at one side of the cover for receiving a first periphery portion of the longitudinal rod, a lower ear being formed at the same side of the cover for receiving a second periphery portion of the longitudinal rod;

whereby the lateral rod and the longitudinal rod of the crank have an angle relation less than ninety degrees thus when the longitudinal rod is retained in between the upper ear and the lower ear, a tension between the lateral rod and the longitudinal rod strengthens the retention.

2. A fastening device as claimed in claim 1, wherein the upper ear has a width slightly greater than a radius of the longitudinal rod and the lower ear has a width substantially equaling a diameter of the longitudinal rod.

3. A fastening device as claimed in claim 1, wherein the lateral rod and the longitudinal rod are connected with an angle equaling eighty-eight degrees.

4. A fastening device as claimed in claim 1, wherein the upper ear is formed as a slant surface in an upper corner thereof for guiding the longitudinal rod to be received in between the upper ear and the lower ear.

5. A fastening device as claimed in claim 1, wherein the upper ear is arcuate at a lower surface thereof for receiving a periphery portion of the longitudinal rod of the crank.

6. A fastening device as claimed in claim 1, wherein the lower ear is arcuate at an upper surface thereof for receiving a periphery portion of the longitudinal rod of the crank.

7. A fastening device as claimed in claim 1, wherein the longitudinal rod is domed at one end thereof avoiding a user from being cut when operating the longitudinal rod.

* * * * *